(12) United States Patent
Nakashima et al.

(10) Patent No.: US 12,398,958 B2
(45) Date of Patent: Aug. 26, 2025

(54) COOLING DEVICE

(71) Applicant: Mitsubishi Electric Corporation, Tokyo (JP)

(72) Inventors: Yukio Nakashima, Tokyo (JP); Hiroyuki Ushifusa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 444 days.

(21) Appl. No.: 17/421,032

(22) PCT Filed: Jan. 24, 2019

(86) PCT No.: PCT/JP2019/002247
§ 371 (c)(1),
(2) Date: Jul. 7, 2021

(87) PCT Pub. No.: WO2020/152822
PCT Pub. Date: Jul. 30, 2020

(65) Prior Publication Data
US 2022/0057144 A1  Feb. 24, 2022

(51) Int. Cl.
*F28D 15/02* (2006.01)
*H05K 7/20* (2006.01)

(52) U.S. Cl.
CPC ..... *F28D 15/0275* (2013.01); *H05K 7/20336* (2013.01); *H05K 7/20509* (2013.01)

(58) Field of Classification Search
CPC ............ F28D 15/0275; H05K 7/20336; H05K 7/20509
See application file for complete search history.

(56) References Cited

U.S. PATENT DOCUMENTS

| 5,651,414 A | 7/1997 | Suzuki et al. |
| 2012/0222840 A1 | 9/2012 | Huang |
| 2018/0216895 A1 | 8/2018 | Koda |

FOREIGN PATENT DOCUMENTS

| DE | 102011052710 A1 | 9/2012 |
| DE | 112016004824 B4 | 8/2021 |
| JP | S52116950 A | 9/1977 |
| JP | H10274487 A * | 10/1998 |
| JP | 3020790 B2 | 3/2000 |

(Continued)

OTHER PUBLICATIONS

Office Action issued Indian Patent Application No. 202127030693; Mailed Sep. 20, 2022. 8 Pages.

(Continued)

*Primary Examiner* — Jianying C Atkisson
*Assistant Examiner* — Khaled Ahmed Ali Al Samiri
(74) *Attorney, Agent, or Firm* — BUCHANAN, INGERSOLL & ROONEY PC

(57) ABSTRACT

A cooling device includes a heat-receiving block on which a heat emitter is mounted, a first heat pipe fixed at the heat-receiving block, and a second heat pipe located adjacent to the first heat pipe. The first heat pipe accommodates a first refrigerant in the gas-liquid two-phase state, and the second heat pipe accommodates a second refrigerant in the gas-liquid two-phase state. The ratio of the amount of the second refrigerant in the liquid state to the volume of the second heat pipe is higher than the ratio of the amount of the first refrigerant in the liquid state to the volume of the first heat pipe.

2 Claims, 14 Drawing Sheets

(56) References Cited

FOREIGN PATENT DOCUMENTS

| JP | 2003336976 A | | 11/2003 |
|----|--------------|---|---------|
| JP | 2012184913 A | | 9/2012 |
| JP | 2014159915 A | | 9/2014 |
| JP | 2016205745 A | * | 12/2016 |

OTHER PUBLICATIONS

International Search Report (PCT/ISA/210) with translation and Written Opinion (PCT/ISA/237) mailed on Apr. 9, 2019, by the Japan Patent Office as the International Searching Authority for International Application No. PCT/JP2019/002247. (10 pages).
Office Action dated Mar. 29, 2022, issued in corresponding German Patent Application No. 112019006726.5, 13 pages including 7 pages of English Translation.

* cited by examiner

COOLING DEVICE

TECHNICAL FIELD

The present disclosure relates to a cooling device including heat pipes.

BACKGROUND ART

In order to avoid damage caused by heat emission of electronic components during energization, the electronic components are thermally coupled to a cooling member. The cooling member discharges the heat transferred from the electronic components to the air around the cooling member. The electronic components are accordingly cooled. A typical example of the cooling member is a heat sink including heat pipes. This type of heat sink is disclosed in Patent Literature 1, for example. The heat sink disclosed in Patent Literature 1 includes a base plate to receive heat transferred from electronic components, and heat pipes. The heat pipes include a plate heat pipe fixed at the base plate and cylindrical heat pipes communicating with the plate heat pipe.

CITATION LIST

Patent Literature

Patent Literature 1: Unexamined Japanese Patent Application Publication No. 2003-336976

SUMMARY OF INVENTION

Technical Problem

The heat pipes included in the heat sink disclosed in Patent Literature 1 accommodate a refrigerant in the gas-liquid two-phase state. The refrigerant evaporated by the heat transferred from the electronic components flows from the plate heat pipe into the cylindrical heat pipes. While traveling inside the cylindrical heat pipes, the evaporated refrigerant transfers the heat via the cylindrical heat pipes to the air around the cylindrical heat pipes. The heat transfer from the refrigerant to the air lowers the temperature of the refrigerant and condenses the refrigerant into liquid. The refrigerant in the liquid state flows through the cylindrical heat pipes into the plate heat pipe. The refrigerant thus repeats evaporation and condensation and thereby circulates inside the heat pipes, resulting in cooling of the electronic components.

This refrigerant may freeze when the heat sink is installed in a place in contact with the air at a temperature equal to or lower than the melting point of the refrigerant. In an exemplary case where the heat pipes accommodate pure water as the refrigerant and the heat sink is installed in a place in contact with the air at a temperature of 0° C. or less, the pure water enclosed in the heat pipes may freeze. The frozen refrigerant does not circulate inside the heat pipes and therefore impairs the cooling capacity of the heat sink. The electronic components, which have not been sufficiently cooled, may reach an excessively high temperature to break down.

In response to the above issue, an objective of the present disclosure is to provide a cooling device capable of cooling electronic components even in a low-temperature environment.

Solution to Problem

In order to achieve the above objective, a cooling device according to an aspect of the present disclosure includes: a heat-receiving block, a first heat pipe, a second heat pipe, a first refrigerant in the gas-liquid two-phase state, and a second refrigerant in the gas-liquid two-phase state. The heat-receiving block includes a first main surface to which a heat emitter is fixed. The first heat pipe is fixed at the heat-receiving block. The second heat pipe is fixed at the heat-receiving block and located adjacent to the first heat pipe. The first refrigerant is enclosed in the first heat pipe. The second refrigerant is enclosed in the second heat pipe. At normal temperature, the ratio of the amount of the second refrigerant in the liquid state to the volume of the second heat pipe is higher than the ratio of the amount of the first refrigerant in the liquid state to the volume of the first heat pipe.

Advantageous Effects of Invention

The cooling device according to an aspect of the present disclosure includes the second heat pipe located adjacent to the first heat pipe. At normal temperature, the ratio of the amount of the second refrigerant in the liquid state to the volume of the second heat pipe is higher than the ratio of the amount of the first refrigerant in the liquid state to the volume of the first heat pipe. The second heat pipe that less readily freeze than the first heat pipe is located adjacent to the first heat pipe, and therefore can rapidly melt the frozen first refrigerant inside the first heat pipe. The cooling device is therefore capable of cooling the heat emitter even in a low-temperature environment.

DESCRIPTION OF EMBODIMENTS

Figure 1:
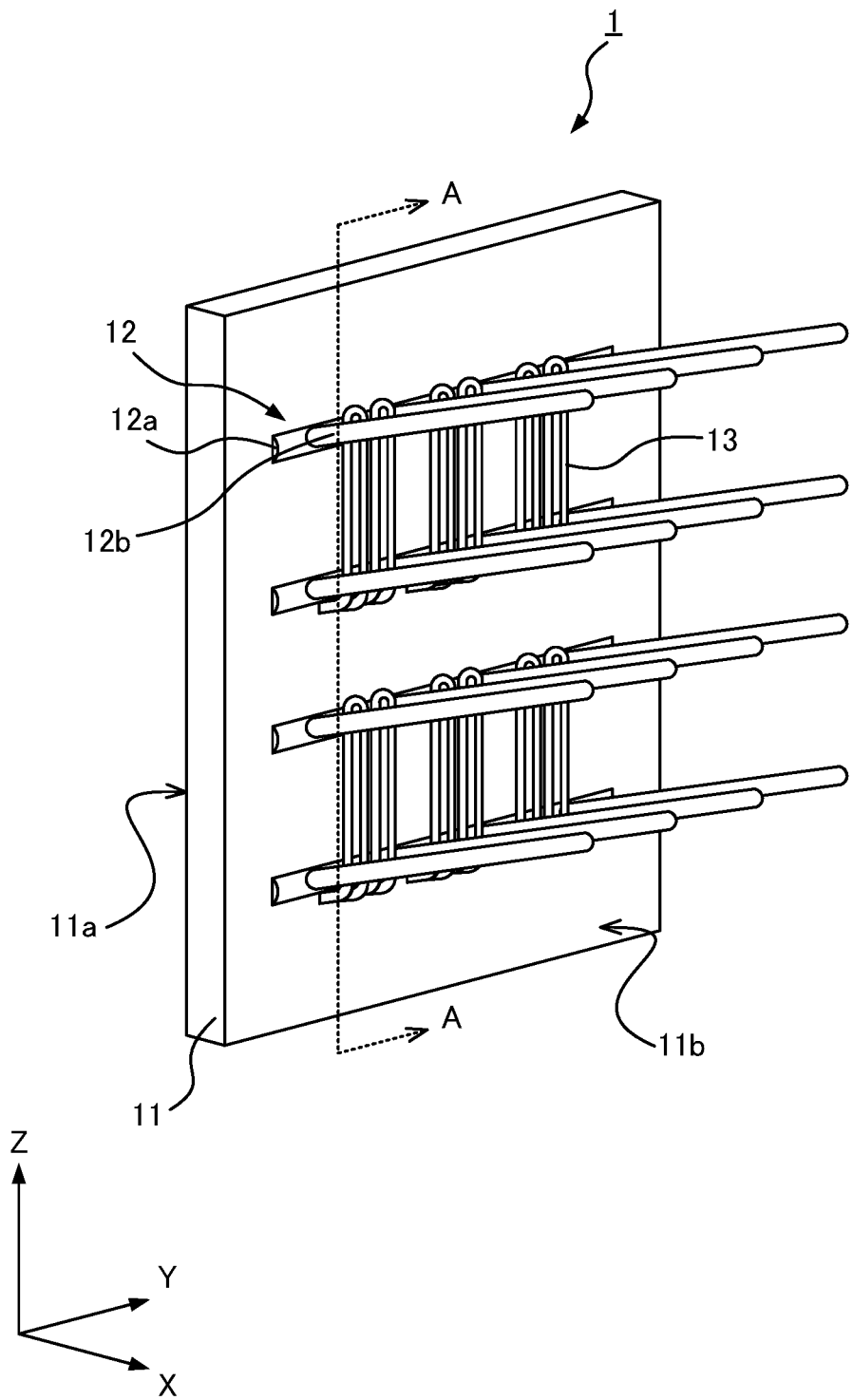
FIG. 1 is a perspective view of a cooling device according to Embodiment 1 of the present disclosure.

A cooling device according to embodiments of the present disclosure is described in detail with reference to the accompanying drawings. The identical or corresponding components are provided with the same reference symbol.

Embodiment 1

In order to avoid failure of electronic components due to heat emission from the electronic components during energization, the electronic components are thermally coupled to a cooling device for cooling the electronic components. A cooling device 1 according to Embodiment 1 illustrated in FIG. 1 includes a heat-receiving block 11 to which heat emitters are fixed, first heat pipes 12 fixed at the heat-receiving block 11 to discharge the heat transferred from the heat emitters and thereby cool the heat emitters, and second heat pipes 13 fixed at the heat-receiving block 11 and located adjacent to the first heat pipes 12. Each of the first heat pipes 12 includes a primary pipe portion 12a fixed at the heat-receiving block 11, and secondary pipe portions 12b that are communicating with the primary pipe portion 12a and extend in the direction away from the heat-receiving block 11. The meaning of fixation encompasses integral formation. Specifically, the primary pipe portions 12a fixed at the heat-receiving block 11 may be formed integrally with the heat-receiving block 11. Also, the second heat pipes 13 fixed at the heat-receiving block 11 may be formed integrally with the heat-receiving block 11.

Figure 2:
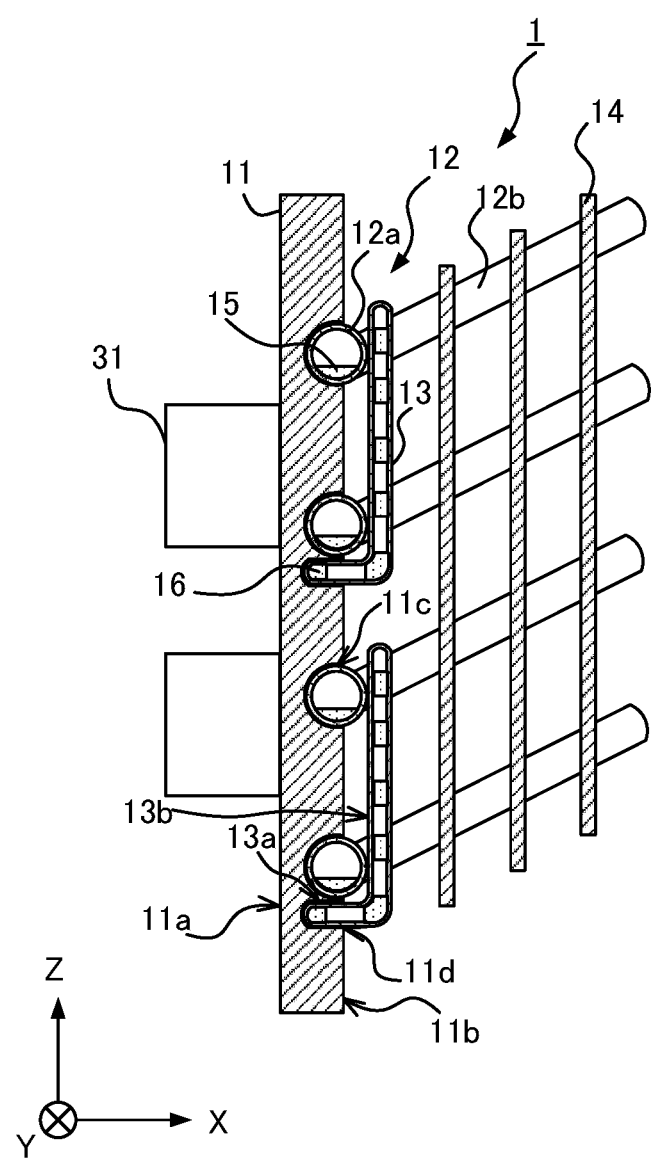
FIG. 2 is a sectional view of the cooling device according to Embodiment 1 taken along the line A-A of FIG. 1.

As illustrated in FIG. 2, which is a sectional view taken along the line A-A of FIG. 1, the cooling device 1 further includes fins 14 fixed across the secondary pipe portions 12b. The fins 14 are not shown in FIG. 1 in order to facilitate an understanding. The cooling device 1 also includes a first refrigerant 15 in the gas-liquid two-phase state enclosed in the first heat pipes 12, and a second refrigerant 16 in the gas-liquid two-phase state enclosed in the second heat pipes 13.

In FIGS. 1 and 2, the Z axis corresponds to the vertical direction. The X axis is orthogonal to both of a first main surface 11a and a second main surface 11b of the heat-receiving block 11, and the Y axis is orthogonal to both of the X and Z axes.

The components of the cooling device 1 having the above-mentioned configuration are described, focusing on an example in which the cooling device 1 includes four primary pipe portions 12a, each of which is communicating with four secondary pipe portions 12b.

As illustrated in FIG. 2, the first main surface 11a of the heat-receiving block 11 is provided with heat emitters 31 fixed thereto. The heat emitters 31 include electronic components that emit heat during energization. The second main surface 11b of the heat-receiving block 11, opposite to the first main surface 11a, is provided with grooves 11c extending in the Y-axis direction and grooves 11d extending in the Y-axis direction. Each of the grooves 11c receives the primary pipe portion 12a inserted thereto. The primary pipe portions 12a are fixed at the heat-receiving block 11 by any fixing procedure, such as bonding with an adhesive or soldering.

Each of the grooves 11d receives the second heat pipe 13 inserted thereto. The second heat pipes 13 are fixed at the heat-receiving block 11 by any fixing procedure, such as bonding with an adhesive or soldering. The grooves 11d are located adjacent to the grooves 11c. Specifically, the grooves 11d are provided in the vicinity of the grooves 11c such that the frozen first refrigerant 15 can be melted by transfer of the heat from the second heat pipes 13 fitted in the grooves 11d to the primary pipe portions 12a fitted in the grooves 11c, as described below. The heat-receiving block 11 is made of a material having a high thermal conductivity, for example, a metal, such as copper or aluminum.

Each of the first heat pipes 12 includes the primary pipe portion 12a and the secondary pipe portions 12b that are communicating with the primary pipe portion 12a. The first heat pipes 12 accommodate the first refrigerant 15.

The primary pipe portions 12a are fitted in the respective grooves 11c and fixed at the heat-receiving block 11. The primary pipe portions 12a are fixed at the heat-receiving block 11 while being partially exposed from the heat-receiving block 11. The primary pipe portions 12a are made of a material having a high thermal conductivity, for example, a metal, such as copper or aluminum.

The secondary pipe portions 12b are fixed at the respective primary pipe portions 12a by a procedure, such as welding or soldering, and are communicating with the respective primary pipe portions 12a. The secondary pipe portions 12b extend in the direction away from the second main surface 11b. The secondary pipe portions 12b are made of a material having a high thermal conductivity, for example, a metal, such as copper or aluminum.

Figure 3:
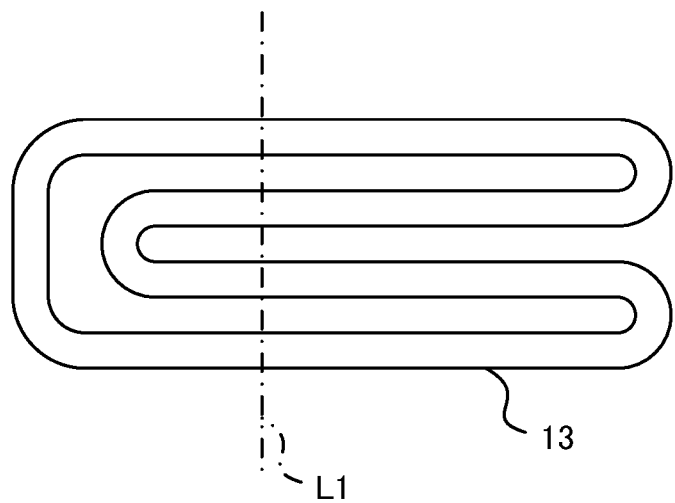
FIG. 3 illustrates a second heat pipe according to Embodiment 1.

Each of the second heat pipes 13 includes an end fitted in the groove 11d and fixed at the heat-receiving block 11. The second heat pipe 13 defines a flow path of which the initial point and the terminal point coincide with each other and which winds between the edge close to the heat-receiving block 11 and the edge distant from the heat-receiving block 11. In the section orthogonal to the Y axis, that is, in the XZ plane, the second heat pipe 13 fixed at the heat-receiving block 11 extends along parts of the outer peripheries of the primary pipe portions 12a. Specifically, as illustrated in FIG. 3, the second heat pipe 13 of a self-excited oscillation type has a winding flow path of which the initial point and the terminal point coincide with each other. The second heat pipe 13 is bent at 90° along the bending line L1 represented in the dashed and single-dotted line, fitted in the groove 11d, and then fixed at the heat-receiving block 11.

As illustrated in FIG. 2, the second heat pipe 13 includes a surface 13a that faces the positive Z-axis direction and a surface 13b that faces the negative X-axis direction. The second heat pipe 13 is located adjacent to the first heat pipes 12. Specifically, the second heat pipe 13 is located adjacent to the primary pipe portions 12a such that the frozen first refrigerant 15 can be melted by transfer of the heat from the heat emitters 31 via the individual surfaces 13a and 13b to the primary pipe portions 12a. For example, the second heat pipe 13 is distant from the primary pipe portions 12a by 100 millimeters or less. The surfaces 13a and 13b may preferably be in contact with the primary pipe portions 12a.

Each of the fins 14 has through holes, and is fixed across the secondary pipe portions 12b while the secondary pipe portions 12b extend through the respective through holes. The fins 14 can contribute to improve the cooling efficiency of the cooling device 1.

The first refrigerant 15 is enclosed in the first heat pipes 12 in the gas-liquid two-phase state. The first refrigerant 15 is made of a substance, such as water, evaporated when receiving heat from the heat emitters 31 and condensed into liquid when discharging heat to the air around the cooling device 1.

The second refrigerant 16 is enclosed in the second heat pipes 13 in the gas-liquid two-phase state. The internal space of each second heat pipe 13 is closed by droplets of the second refrigerant 16 due to a function of the surface tension of the second refrigerant 16, so that the second refrigerant 16 in the liquid state and the second refrigerant 16 in the gas state are distributed inside the second heat pipe 13. The second refrigerant 16 is made of a substance, such as water, evaporated when receiving heat from the heat emitters 31 and condensed into liquid when discharging heat to the air around the cooling device 1.

At normal temperature, the ratio of the amount of the second refrigerant 16 in the liquid state to the volume of the second heat pipe 13 is higher than the ratio of the amount of the first refrigerant 15 in the liquid state to the volume of the first heat pipe 12. The second heat pipes 13 therefore less readily freeze than the first heat pipes 12. For example, the ratio of the amount of the second refrigerant 16 in the liquid state to the volume of the second heat pipe 13 is preferably be 50%, while the ratio of the amount of the first refrigerant 15 in the liquid state to the volume of the first heat pipe 12 is preferably be 20%.

Figure 4:
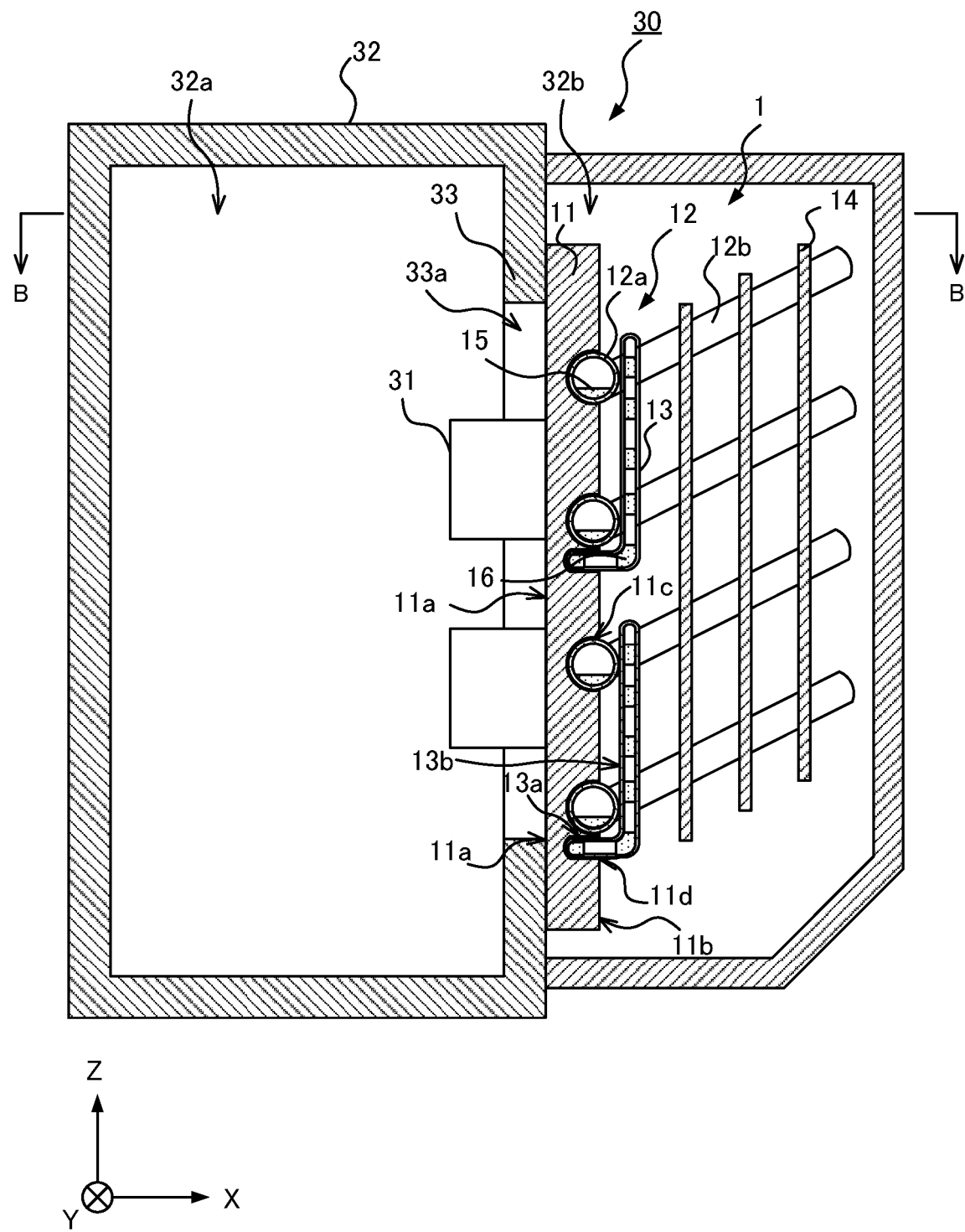
FIG. 4 is a sectional view of a power conversion apparatus according to Embodiment 1.
Figure 5:
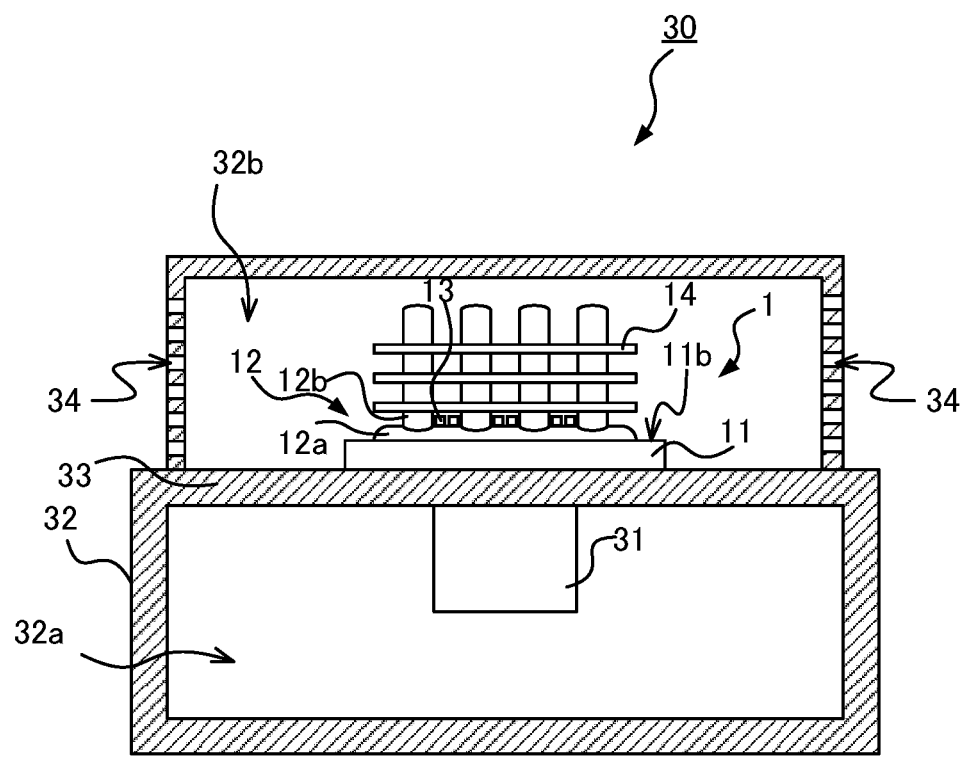
FIG. 5 is a sectional view of the power conversion apparatus according to Embodiment 1 taken along the line B-B of FIG. 4.

The cooling device 1 having the above-mentioned configuration is installed in a power conversion apparatus 30, as illustrated in FIGS. 4 and 5. FIG. 5 is a sectional view taken along the line B-B of FIG. 4. The power conversion apparatus 30 includes a housing 32, the heat emitters 31 accommodated in the housing 32, and the cooling device 1 to cool the heat emitters 31. The housing 32 includes a partition 33 to divide the internal space of the housing 32 into a closed compartment 32a and an open compartment 32b. The closed compartment 32a accommodates the heat emitters 31. The open compartment 32b accommodates the cooling device 1. The partition 33 has an opening 33a. The opening 33a is closed by the first main surface 11a of the heat-receiving block 11 included in the cooling device 1. The heat emitters 31 are mounted on the first main surface 11a that closes the opening 33a. The closing of the opening 33a by the first main surface 11a can prevent the external air, water, dust, or the like from entering the closed compartment 32a.

The housing 32 also has intake and exhaust ports 34 in the two walls that face the open compartment 32b and are orthogonal to the Y-axis direction. Cooling air introduced through one of the intake and exhaust ports 34 in one wall flows between the secondary pipe portions 12b along the fins 14 and then exits through the other one of the intake and exhaust ports 34 in the other wall. The cooling device 1 transfers the heat from the heat emitters 31 to the cooling air, to thereby cool the heat emitters 31.

A mechanism of cooling the heat emitters 31 in the cooling device 1 having the above-mentioned configuration is described. When the heat emitters 31 emit heat, the heat is transferred from the heat emitters 31 via the heat-receiving block 11 and the primary pipe portions 12a to the first refrigerant 15. The transferred heat raises the temperature of the first refrigerant 15 and evaporates a part of the first refrigerant 15. The evaporated first refrigerant 15 flows from the primary pipe portions 12a into the secondary pipe portions 12b, and travels inside the secondary pipe portions 12b toward the upper edges in the vertical direction of the secondary pipe portions 12b. During the travel inside the secondary pipe portions 12b toward the upper edges in the vertical direction of the secondary pipe portions 12b, the first refrigerant 15 discharges heat to the air around the cooling device 1 via the secondary pipe portions 12b and the fins 14. The heat discharge from the first refrigerant 15 lowers the temperature of the first refrigerant 15. The first refrigerant 15 is accordingly condensed into liquid. The first refrigerant 15 in the liquid state moves along the inner walls of the secondary pipe portions 12b and returns to the primary pipe portions 12a. When the first refrigerant 15 in the liquid state receives the heat from the heat emitters 31 via the heat-receiving block 11, the first refrigerant 15 is evaporated again, flows into the secondary pipe portions 12b, and then travels toward the upper edges in the vertical direction of the secondary pipe portions 12b. The first refrigerant 15 thus repeats the above-described evaporation and condensation and thereby circulates, so that the heat generated at the heat emitters 31 is discharged to the air around the cooling device 1, specifically, the air around the secondary pipe portions 12b and the fins 14, resulting in cooling of the heat emitters 31.

If the heat emitted from the heat emitters 31 is transferred from the heat emitters 31 via the heat-receiving block 11 and the primary pipe portions 12a to the first refrigerant 15, then the first refrigerant 15 that has not been evaporated, that is, the first refrigerant 15 in the liquid state has internal temperature differences and generates convection. The convection allows the first refrigerant 15 to diffuse and transfer the heat from the heat emitters 31 in the Y-axis direction, leading to efficient cooling of the heat emitters 31.

When the heat emitters 31 emit heat, the heat is also transferred from the heat emitters 31 via the heat-receiving block 11 and the second heat pipes 13 to the second refrigerant 16. The transferred heat evaporates a part of the second refrigerant 16 in the liquid state. The evaporated second refrigerant 16 has an increased volume and urges the second refrigerant 16 in the liquid state and the second refrigerant 16 in the gas state to travel toward the edges distant from the heat-receiving block 11, in other words, the upper edges in the vertical direction. During the travel inside the second heat pipes 13 toward the upper edges in the vertical direction, the evaporated second refrigerant 16 discharges heat to the air around the cooling device 1 via the second heat pipes 13. The heat discharge from the second refrigerant 16 lowers the temperature of the second refrigerant 16. The second refrigerant 16 is accordingly condensed into liquid. The second refrigerant 16 in the liquid state moves along the inner walls of the second heat pipes 13 downward in the vertical direction. When the second refrigerant 16 in the liquid state receives heat from the heat emitters 31 via the heat-receiving block 11, the second refrigerant 16 is evaporated again. The second refrigerant 16 thus repeats the evaporation and condensation and thereby circulates, so that the heat generated at the heat emitters 31 is discharged to the air around the cooling device 1, specifically, the air around the second heat pipes 13, resulting in cooling of the heat emitters 31.

The frozen first refrigerant 15, however, does not make the above-described circulation and convection, and does not enable the cooling device 1 to cool the heat emitters 31. Specifically, if the air around the cooling device 1 reaches 0° C. or less during no energization of the electronic components included in the heat emitters 31, the first refrigerant 15 made of water may freeze. The frozen first refrigerant 15 needs to be melted in order to prevent deterioration of the cooling efficiency of the cooling device 1.

A mechanism of melting the frozen first refrigerant 15 in the cooling device 1 is described. When the heat emitters 31 emit heat, the heat is transferred via the heat-receiving block 11 and the first heat pipes 12 to the first refrigerant 15. The heat generated at the heat emitters 31 is also transferred to the second heat pipes 13, and is then transferred from the individual surfaces 13a and 13b of the second heat pipes 13 located adjacent to the primary pipe portions 12a, via the primary pipe portions 12a to the first refrigerant 15. As a result, the heat is transferred to the frozen first refrigerant 15 in multiple ways, not only at the parts of the primary pipe portions 12a that face the heat-receiving block 11 but also at the parts of the primary pipe portions 12a that do not face the heat-receiving block 11 via the second heat pipes 13. The cooling device 1 can therefore melt the frozen first refrigerant 15 more rapidly than an existing heat-pipe cooling device without the second heat pipes 13.

As described above, the cooling device 1 according to Embodiment 1 can rapidly melt the frozen first refrigerant 15 because of the second heat pipes 13. The cooling device 1 can therefore cool the heat emitters 31 even in a low-temperature environment.

Embodiment 2

Figure 6:
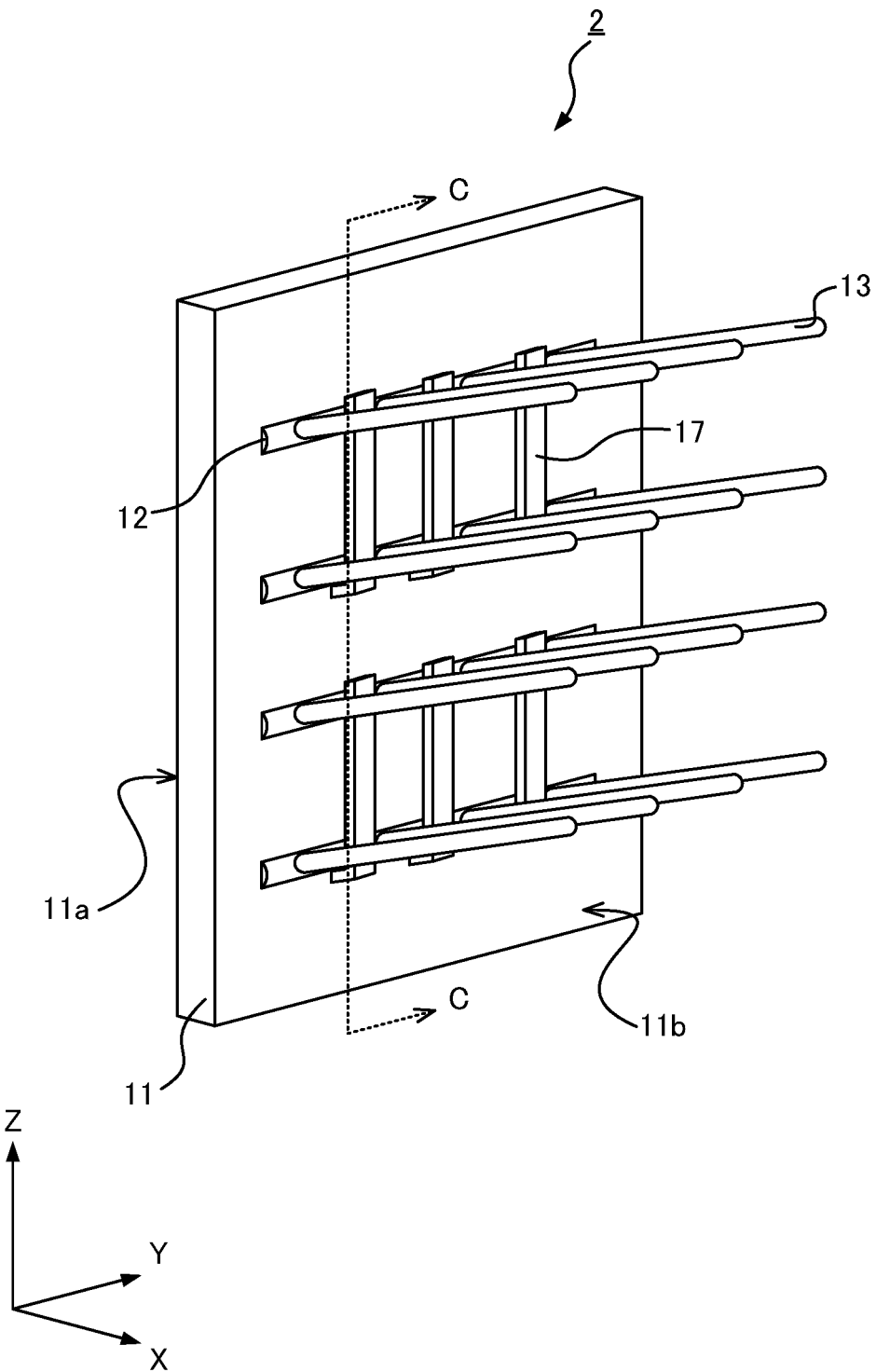
FIG. 6 is a perspective view of a cooling device according to Embodiment 2 of the present disclosure.

The second heat pipes 13 may have any structure provided that the second heat pipes 13 less readily freeze than the first heat pipes 12 and can melt the frozen first refrigerant 15. A cooling device 2 according to Embodiment 2 illustrated in FIGS. 6 and 7 includes second heat pipes 17 in place of the second heat pipes 13. The cooling device 2 has the structure identical to that of the cooling device 1 except for the second heat pipes 17 and the shape of the heat-receiving block 11. The cooling device 2 can be installed in the power conversion apparatus 30, like the cooling device 1.

The heat-receiving block 11 included in the cooling device 2 is provided with grooves 11e instead of the grooves 11d. Each of the grooves 11e receives one end of the second heat pipe 17 inserted thereto.

Figure 8:
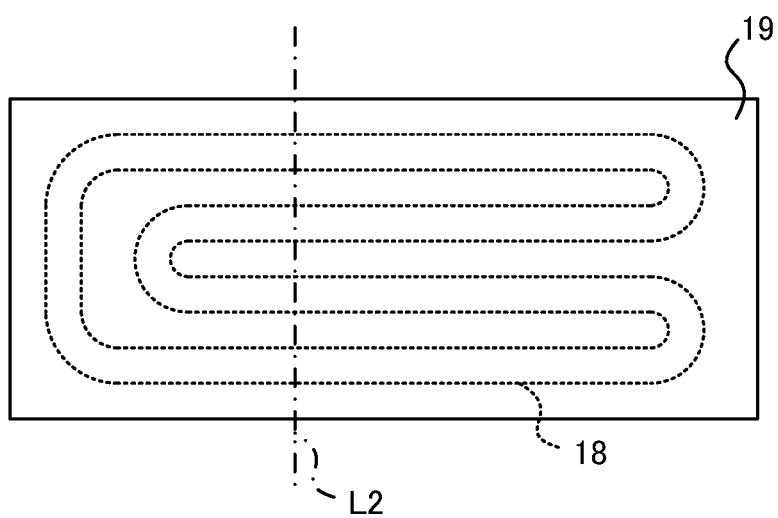
FIG. 8 is a top view of a plate member constituting a second heat pipe according to Embodiment 2.

The one end of the second heat pipe 17 is fitted in the groove 11e and fixed at the heat-receiving block 11 by a procedure, such as bonding with an adhesive or soldering. The second heat pipe 17 includes a plate member 19 having an internal flow path 18. Specifically, as illustrated in FIG. 8, the plate member 19 has a flat shape and provided with the winding internal flow path 18 of which the initial point and the terminal point coincide with each other. This plate member 19 is bent at 90° along the bending line L2 represented in the dashed and single-dotted line, thereby yielding the second heat pipe 17. The flow path 18 accommodates the second refrigerant 16 in the gas-liquid two-phase state, as in Embodiment 1. The plate member 19 is made of a material excellent in thermal conductivity and processability, for example, a metal, such as copper or aluminum.

Figure 7:
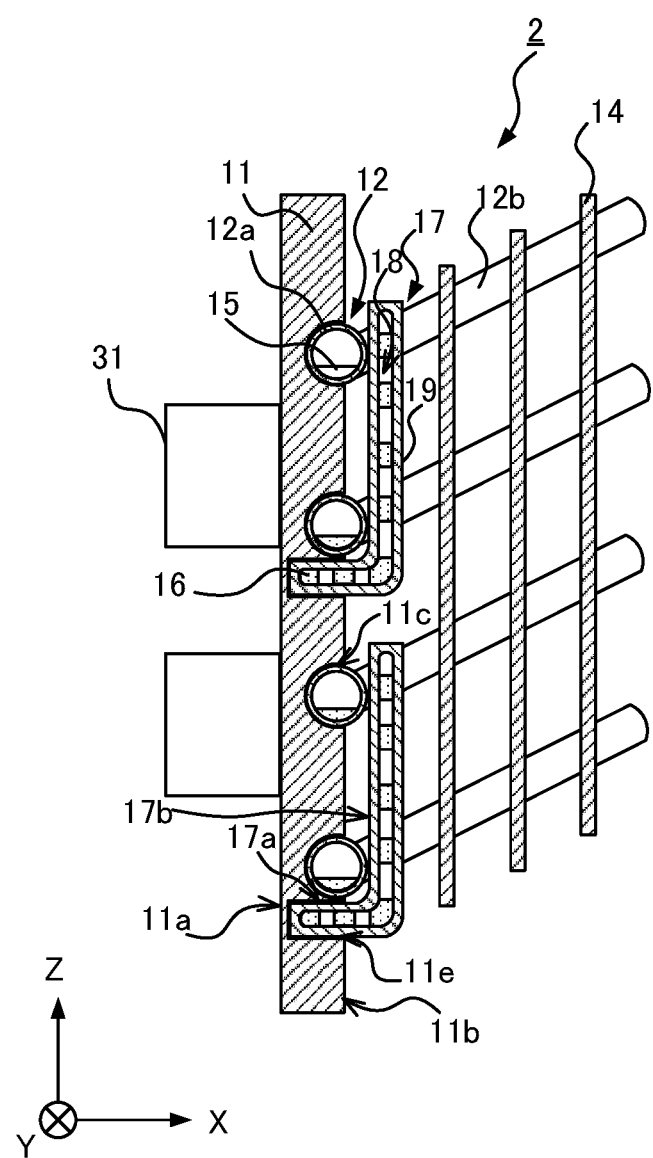
FIG. 7 is a sectional view of the cooling device according to Embodiment 2 taken along the line C-C of FIG. 6.

The second heat pipe 17 fabricated by bending the plate member 19 as described above includes a surface 17a that faces the positive Z-axis direction and a surface 17b that faces the negative X-axis direction, as illustrated in FIG. 7. The second heat pipe 17 is located adjacent to the first heat pipes 12. Specifically, the second heat pipe 17 is located adjacent to the primary pipe portions 12a such that the frozen first refrigerant 15 can be melted by transfer of the heat from the heat emitters 31 via the individual surfaces 17a and 17b to the primary pipe portions 12a. The surfaces 17a and 17b may preferably be in contact with the primary pipe portions 12a.

At normal temperature, the ratio of the amount of the second refrigerant 16 in the liquid state to the volume of the flow path 18 in the second heat pipe 17 is higher than the ratio of the amount of the first refrigerant 15 in the liquid state to the volume of the first heat pipe 12, as in Embodiment 1. The second heat pipes 17 therefore less readily freeze than the first heat pipes 12. For example, the ratio of the amount of the second refrigerant 16 in the liquid state to the volume of the flow path 18 in the second heat pipe 17 is preferably be 50%, while the ratio of the amount of the first refrigerant 15 in the liquid state to the volume of the first heat pipe 12 is preferably be 20%.

A mechanism of cooling the heat emitters 31 in the cooling device 2 having the above-mentioned configuration is described. The first heat pipes 12 cool the heat emitters 31 by the mechanism identical to that in Embodiment 1. The following description is thus directed to a mechanism of the second heat pipes 17 cooling the heat emitters 31.

When the heat emitters 31 emit heat, the heat is transferred from the heat emitters 31 via the heat-receiving block 11 and the plate members 19 to the second refrigerant 16. The transferred heat evaporates a part of the second refrigerant 16 in the liquid state. The evaporated second refrigerant 16 has an increased volume and urges the second refrigerant 16 in the liquid state and the second refrigerant 16 in the gas state to travel toward the edges distant from the heat-receiving block 11, in other words, the upper edges in the vertical direction. During the travel through the flow paths 18 toward the upper edges in the vertical direction, the evaporated second refrigerant 16 discharges heat to the air around the cooling device 2 via the plate members 19. The heat discharge from the second refrigerant 16 lowers the temperature of the second refrigerant 16. The second refrigerant 16 is accordingly condensed into liquid. The second refrigerant 16 in the liquid state moves along the inner walls of the flow paths 18 downward in the vertical direction. When the second refrigerant 16 in the liquid state receives heat from the heat emitters 31 via the heat-receiving block 11 and the plate members 19, the second refrigerant 16 is evaporated again. The second refrigerant 16 thus repeats the evaporation and condensation and thereby circulates, so that the heat generated at the heat emitters 31 is discharged to the air around the cooling device 2, specifically, the air around the second heat pipes 17, resulting in cooling of the heat emitters 31.

In addition, a part of the heat transferred from the heat emitters 31 via the heat-receiving block 11 to the plate members 19 constituting the second heat pipes 17 is discharged from the plate members 19 directly to the ambient air, resulting in cooling of the heat emitters 31.

A mechanism of melting the frozen first refrigerant 15 in the cooling device 2 is described. When the heat emitters 31 emit heat, the heat is transferred via the heat-receiving block 11 and the first heat pipes 12 to the first refrigerant 15, as in Embodiment 1.

The heat generated at the heat emitters 31 is also transferred to the second heat pipes 17, and is then transferred from the individual surfaces 17a and 17b of the second heat pipes 17 located adjacent to the primary pipe portions 12a, via the primary pipe portions 12a to the first refrigerant 15. That is, the heat is transferred to the frozen first refrigerant 15 in multiple ways, not only at the parts of the primary pipe portions 12a that face the heat-receiving block 11 but also at the parts of the primary pipe portions 12a that do not face the heat-receiving block 11 via the second heat pipes 17. The cooling device 2 can therefore melt the frozen first refrigerant 15 more rapidly than an existing heat-pipe cooling device without the second heat pipes 17.

As described above, the cooling device 2 according to Embodiment 2 can rapidly melt the frozen first refrigerant 15 because of the second heat pipes 17. The cooling device 2 can therefore cool the heat emitters 31 even in a low-temperature environment.

In addition, the flow paths 18 in the second heat pipes 17 are formed inside the plate members 19, and are therefore less susceptible to a variation in the temperature of the air around the cooling device 2 and less readily freeze than the second heat pipes 13 included in the cooling device 1 according to Embodiment 1.

Furthermore, the distance between the second heat pipes 17 and the heat emitters 31 is shorter than the distance between the primary pipe portions 12a and the heat emitters 31. The heat generated at the heat emitters 31 is therefore transferred to the second heat pipes 17 more rapidly than to the primary pipe portions 12a. This configuration can achieve efficient heat transfer from the second heat pipes 17 via the primary pipe portions 12a to the first refrigerant 15, leading to rapid melting of the frozen first refrigerant 15.

Embodiment 3

The second heat pipes 13 may have any structure provided that the second heat pipes 13 less readily freeze than the first heat pipes 12 and can melt the frozen first refrigerant 15. A cooling device 3 according to Embodiment 3 illustrated in FIG. 9 includes second heat pipes 20 in place of the second heat pipes 13. The cooling device 3 has the structure identical to that of the cooling device 1 except for the second heat pipes 20 and the shape of the heat-receiving block 11. The cooling device 3 can be installed in the power conversion apparatus 30, like the cooling devices 1 and 2.

The heat-receiving block 11 included in the cooling device 3 is provided with the grooves 11e like those of the heat-receiving block 11 included in the cooling device 2, and grooves 11f. Each of the grooves 11e receives one end of the second heat pipe 20, while the groove 11f, disposed above the groove 11e in the vertical direction with the two grooves 11c between the grooves 11f and 11e, receives the other end of the second heat pipe 20.

Figure 10:
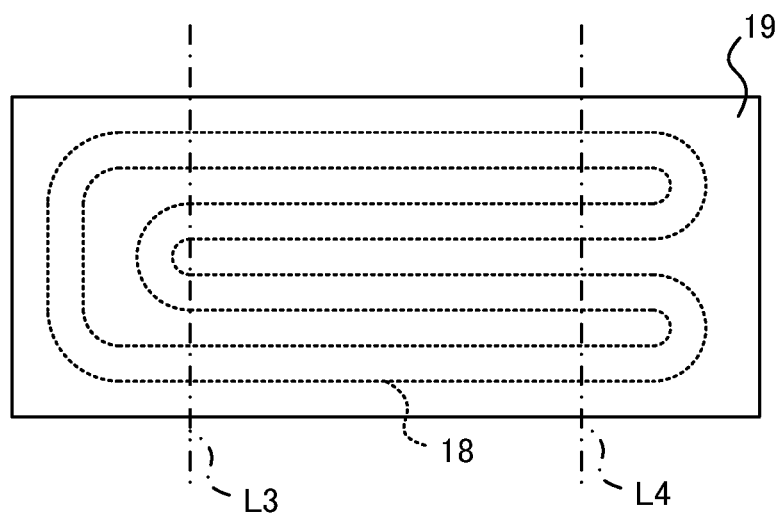
FIG. 10 is a top view of a plate member constituting a second heat pipe according to Embodiment 3.

The one end of the second heat pipe 20 is fitted in the groove 11e while the other end is fitted in the groove 11f. The second heat pipe 20 is then fixed at the heat-receiving block 11 by a procedure, such as bonding with an adhesive or soldering. The second heat pipe 20 is fabricated by bending the plate member 19 like that in Embodiment 2. Specifically, as illustrated in FIG. 10, the plate member 19 has a flat shape and provided with the winding internal flow path 18 of which the initial point and the terminal point coincide with each other. This plate member 19 is bent at 90° along the bending lines L3 and L4 represented in the dashed and single-dotted lines, thereby yielding the second heat pipe 20. The direction of bending the plate member 19 along the bending line L3 is identical to the direction of bending the plate member 19 along the bending line L4.

Figure 9:
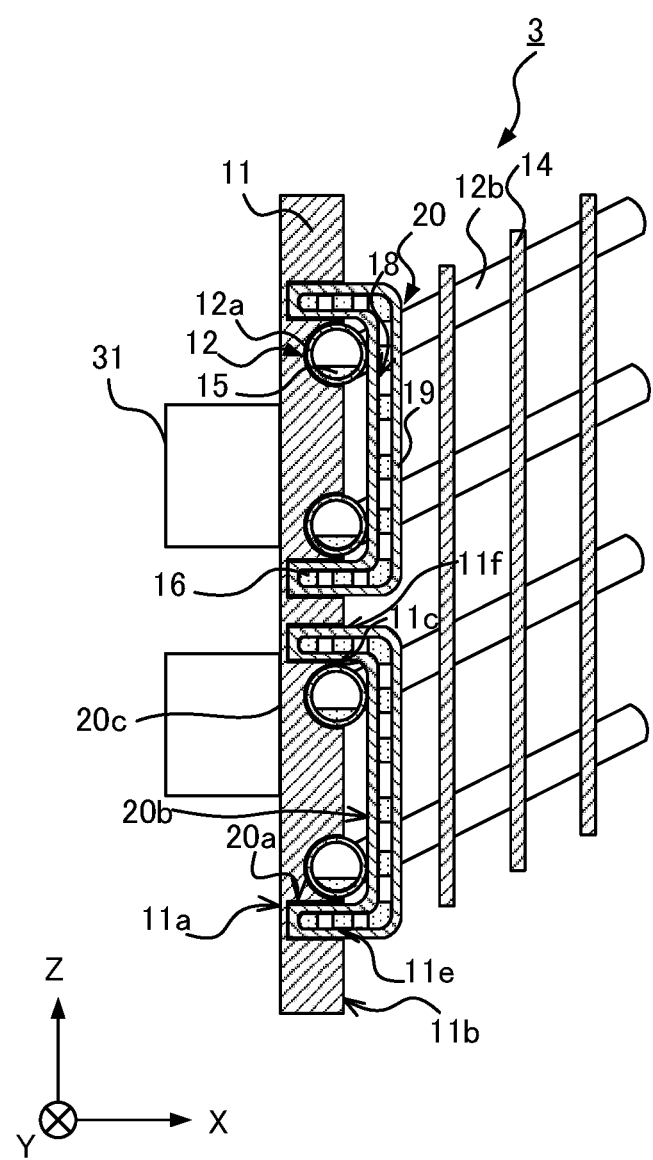
FIG. 9 is a sectional view of a cooling device according to Embodiment 3 of the present disclosure.

The second heat pipe 20 fabricated by bending the plate member 19 as described above includes a surface 20a that faces the positive Z-axis direction, a surface 20b that faces the negative X-axis direction, and a surface 20c that faces the negative Z-axis direction, as illustrated in FIG. 9. The second heat pipe 20 is located adjacent to the first heat pipes 12. Specifically, the second heat pipe 20 is located adjacent to the primary pipe portions 12a such that the heat from the heat emitters 31 can be transferred via the individual surfaces 20a, 20b, and 20c to the primary pipe portions 12a. The surfaces 20a, 20b, and 20c of the second heat pipes 20 may preferably be in contact with the primary pipe portions 12a.

At normal temperature, the ratio of the amount of the second refrigerant 16 in the liquid state to the volume of the flow path 18 in the second heat pipe 20 is higher than the ratio of the amount of the first refrigerant 15 in the liquid state to the volume of the first heat pipe 12, as in Embodiment 1. The second heat pipes 20 therefore less readily freeze than the first heat pipes 12. For example, the ratio of the amount of the second refrigerant 16 in the liquid state to the volume of the flow path 18 in the second heat pipe 20 is preferably be 50%, while the ratio of the amount of the first refrigerant 15 in the liquid state to the volume of the first heat pipe 12 is preferably be 20%.

The first heat pipes 12 cool the heat emitters 31 by the mechanism identical to that in Embodiment 1. The second heat pipes 20 cool the heat emitters 31 by the mechanism identical to that in Embodiment 2. Both edges of each plate member 19 constituting the second heat pipe 20 are fixed at the heat-receiving block 11, so that both edges of the flow path 18 are warmed by the heat transferred from the heat emitters 31 via the heat-receiving block 11. Accordingly, the evaporated second refrigerant 16 has an increased volume and urges the second refrigerant 16 in the liquid state and the second refrigerant 16 in the gas state to travel toward the middle portion of the flow path 18, in other words, the center of the plate member 19 in the longitudinal direction.

A mechanism of melting the frozen first refrigerant 15 in the cooling device 3 is described. When the heat emitters 31 emit heat, the heat is transferred via the heat-receiving block 11 and the first heat pipes 12 to the first refrigerant 15.

The heat generated at the heat emitters 31 is also transferred to the second heat pipes 20, and is then transferred from the individual surfaces 20a, 20b, and 20c of the second heat pipes 20 located adjacent to the primary pipe portions 12a, via the primary pipe portions 12a to the first refrigerant 15. That is, the heat is transferred to the frozen first refrigerant 15 in multiple ways, not only at the parts of the primary pipe portions 12a that face the heat-receiving block 11 but also at the parts of the primary pipe portions 12a that do not face the heat-receiving block 11 via the second heat pipes 20. The cooling device 3 can therefore melt the frozen first refrigerant 15 more rapidly than an existing heat-pipe cooling device without the second heat pipes 20.

In addition, the heat generated at the heat emitters 31 is transferred via both edges of the second heat pipes 20 to the second heat pipes 20 because the edges of the second heat pipes 20 are fixed at the heat-receiving block 11. The heat is therefore distributed to the entire second heat pipes 20 more rapidly in comparison to the cases of the second heat pipes 13 and 17. The second heat pipes 20 can thus melt the frozen first refrigerant 15 more rapidly than the second heat pipes 13 and 17.

As described above, the cooling device 3 according to Embodiment 3 can rapidly melt the frozen first refrigerant 15, because of the second heat pipes 20 causing the heat from the heat emitters 31 to be transferred from the surfaces 20a, 20b, and 20c via the primary pipe portions 12a to the first refrigerant 15. The cooling device 3 can therefore cool the heat emitters 31 even in a low-temperature environment.

Embodiment 4

Figure 11:
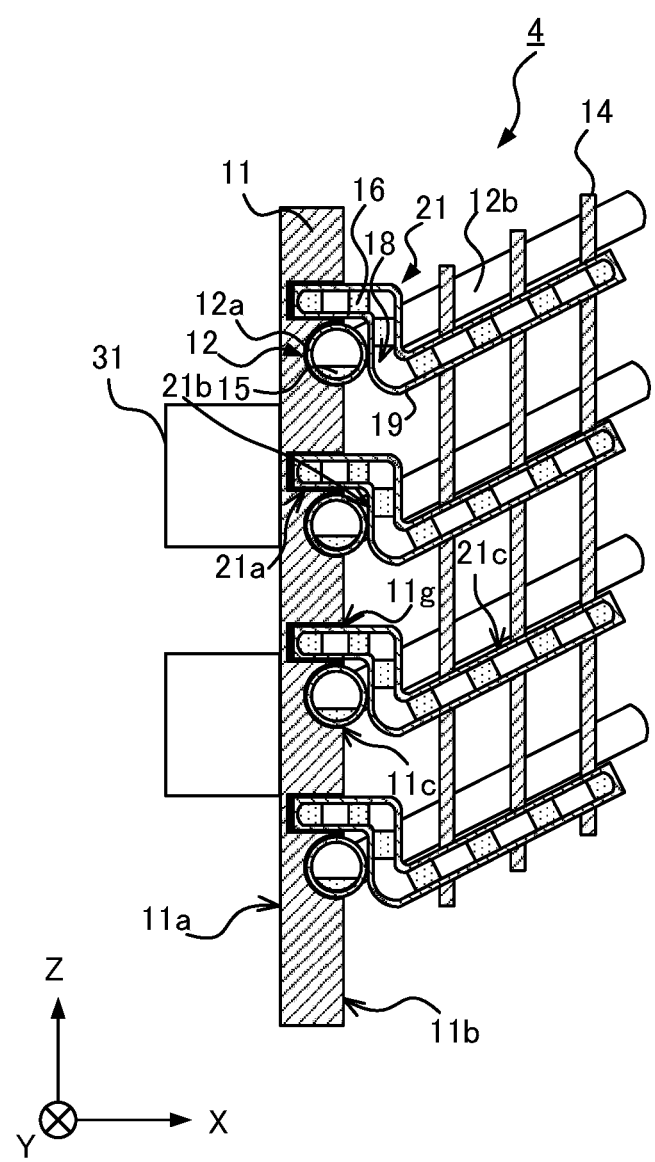
FIG. 11 is a sectional view of a cooling device according to Embodiment 4 of the present disclosure.

Although the second heat pipes 13, 17, and 20 according to Embodiments 1 to 3 extend along parts of the outer peripheries of the primary pipe portions 12a in the XZ plane, the second heat pipes 13, 17, and 20 may extend along parts of the outer peripheries of the primary pipe portions 12a in the XZ plane and also extend along the secondary pipe portions 12b. As illustrated in FIG. 11, a cooling device 4 according to Embodiment 4 includes second heat pipes 21 in place of the second heat pipes 13. The cooling device 4 has the structure identical to that of the cooling device 1 except for the second heat pipes 21 and the shape of the heat-receiving block 11. The cooling device 4 can be installed in the power conversion apparatus 30, like the cooling devices 1 to 3.

The heat-receiving block 11 included in the cooling device 4 is provided with grooves 11g instead of the grooves 11d. Each of the grooves 11g receives the second heat pipe 21 inserted therein. The groove 11g is located adjacent to the groove 11c at the position above the groove 11c in the vertical direction. Specifically, the groove 11g is located adjacent to the groove 11c, such that the frozen first refrigerant 15 can be melted by transfer of the heat from the second heat pipe 21 fitted in the groove 11g to the primary pipe portion 12a fitted in the groove 11c.

Figure 12:
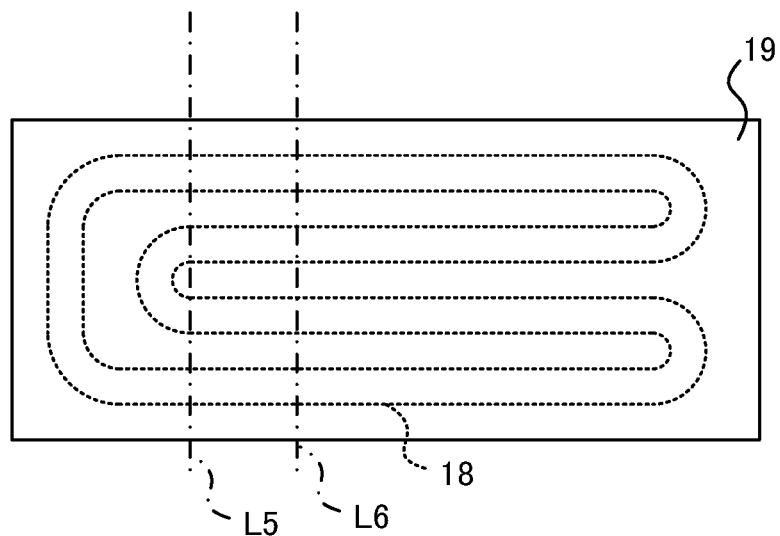
FIG. 12 is a top view of a plate member constituting a second heat pipe according to Embodiment 4.

The second heat pipe 21 is fitted in the groove 11g and then fixed at the heat-receiving block 11 by a procedure, such as bonding with an adhesive or soldering. The second heat pipe 21 includes the internal flow path 18. Specifically, as illustrated in FIG. 12, the plate member 19 has a flat shape and provided with the winding internal flow path 18 of which the initial point and the terminal point coincide with each other. This plate member 19 is bent at 90° along the bending line L5 represented in a dashed and single-dotted line and bent along the bending line L6 represented in a dashed and single-dotted line at the angle defined between the horizontal direction and the direction of extension of the secondary pipe portion 12b, thereby yielding the second heat pipe 21. The direction of bending the plate member 19 along the bending line L5 is opposite to the direction of bending the plate member 19 along the bending line L6. The second heat pipe 21 is fabricated by bending the plate member 19 at the angle defined between the horizontal direction and the direction of extension of the secondary pipe portion 12b, and thus extends along the secondary pipe portion 12b while being fixed at the heat-receiving block 11.

The second heat pipe 21 fabricated by bending the plate member 19 as described above includes a surface 21a that faces the negative Z-axis direction, a surface 21b that faces the negative X-axis direction, and a surface 21c extending along the secondary pipe portion 12b, as illustrated in FIG. 11. The second heat pipe 21 is located adjacent to the primary pipe portion 12a. Specifically, the second heat pipe 21 is located adjacent to the primary pipe portion 12a, such that the heat from the heat emitters 31 can be transferred via the individual surfaces 21a and 21b to the primary pipe portion 12a. The surfaces 21a and 21b of the second heat pipe 21 may preferably be in contact with the primary pipe portion 12a. Also, the second heat pipe 21 is located adjacent to the secondary pipe portion 12b and extends along the secondary pipe portion 12b such that the heat from the heat emitters 31 can be transferred via the surface 21c to the secondary pipe portion 12b. The surface 21c of the second heat pipe 21 may preferably be in contact with the secondary pipe portion 12b.

At normal temperature, the ratio of the amount of the second refrigerant 16 in the liquid state to the volume of the flow path 18 in the second heat pipe 21 is higher than the ratio of the amount of the first refrigerant 15 in the liquid state to the volume of the first heat pipe 12, as in Embodiment 1. The second heat pipes 21 therefore less readily freeze than the first heat pipes 12. For example, the ratio of the amount of the second refrigerant 16 in the liquid state to the volume of the flow path 18 in the second heat pipe 21 is preferably be 50%, while the ratio of the amount of the first refrigerant 15 in the liquid state to the volume of the first heat pipe 12 is preferably be 20%.

The first heat pipes 12 cool the heat emitters 31 by the mechanism identical to that in Embodiment 1. The second heat pipes 21 cool the heat emitters 31 by the mechanism identical to that in Embodiment 2.

A mechanism of melting the frozen first refrigerant 15 in the cooling device 4 is described. When the heat emitters 31 emit heat, the heat is transferred via the heat-receiving block 11 and the first heat pipes 12 to the first refrigerant 15.

The heat generated at the heat emitters 31 is also transferred to the second heat pipes 21, and is then transferred from the individual surfaces 21a and 21b of the second heat pipes 21 located adjacent to the primary pipe portions 12a, via the primary pipe portions 12a to the first refrigerant 15. That is, the heat is transferred to the frozen first refrigerant 15 in multiple ways, not only at the parts of the primary pipe portions 12a that face the heat-receiving block 11 but also at the parts of the primary pipe portions 12a that do not face the heat-receiving block 11 via the second heat pipes 21.

In addition, the heat transferred to the second heat pipes 21 is transferred from the surfaces 21c via the secondary pipe portions 12b to the first refrigerant 15. The heat is thus also transferred to the first refrigerant 15 frozen in the secondary pipe portions 12b. The cooling device 4 can therefore melt the frozen first refrigerant 15 more rapidly than an existing heat-pipe cooling device without the second heat pipes 21. Furthermore, the cooling device 4 can rapidly melt the first refrigerant 15 frozen in the secondary pipe portions 12b.

As described above, the cooling device 4 according to Embodiment 4 can rapidly melt the frozen first refrigerant 15, because of the second heat pipes 21 causing the heat from the heat emitters 31 to be transferred from the individual surfaces 21a and 21b via the primary pipe portions 12a to the first refrigerant 15 and causing the heat to be transferred from the surfaces 21c via the secondary pipe portions 12b to the first refrigerant 15. The cooling device 4 can therefore cool the heat emitters 31 even in a low-temperature environment.

The above-described embodiments are not construed as limiting the present disclosure. For example, some of the above-described embodiments may be arbitrarily combined. Specifically, the second heat pipes 13 included in the cooling device 1 may have the shape identical to that of the second heat pipes 20 or 21.

The heat-receiving block 11 does not necessarily have a plate shape, and may have any shape provided that the heat emitters 31 can be fixed to the first main surface 11a and the first heat pipes 12 can be fixed at the heat-receiving block 11.

The first heat pipe 12 may have any structure and shape provided that the first heat pipe 12 can discharge the heat transferred from the heat emitters 31. For example, the first heat pipe 12 may include the primary pipe portion 12a alone. The section of the primary pipe portion 12a orthogonal to the longitudinal direction does not necessarily have a circular shape and may also have a flattened shape. Also, the section of the secondary pipe portion 12b orthogonal to the longitudinal direction does not necessarily have a circular shape and may also have a flattened shape. The flattened shape indicates a shape formed by narrowing the width of a part of the circular shape than the original width and encompasses elliptical, streamline, and elongated circular shapes. The elongated circular shape indicates a shape defined by circles having the same diameter and the straight lines connecting the contours of the circles with each other. In this case, when the primary pipe portion 12a is fixed at the heat-receiving block 11 such that the longer axis of the flattened shape is in parallel to the Z-axis direction, this arrangement can improve the efficiency of heat transfer from the heat-receiving block 11 to the primary pipe portion 12a. Furthermore, when the secondary pipe portion 12b is fixed at the primary pipe portion 12a such that the longitudinal direction of the secondary pipe portion 12b coincides with the direction of flow of the cooling air, this configuration can reduce turbulence in the vicinity of the secondary pipe portion 12b, leading to improvement of the cooling efficiency.

The second heat pipes 13, 17, 20, and 21 may have any shape provided that these pipes can melt the frozen first refrigerant 15. For example, the second heat pipes 17, 20, and 21 may include a member having any shape and including the internal flow path 18.

Figure 13:
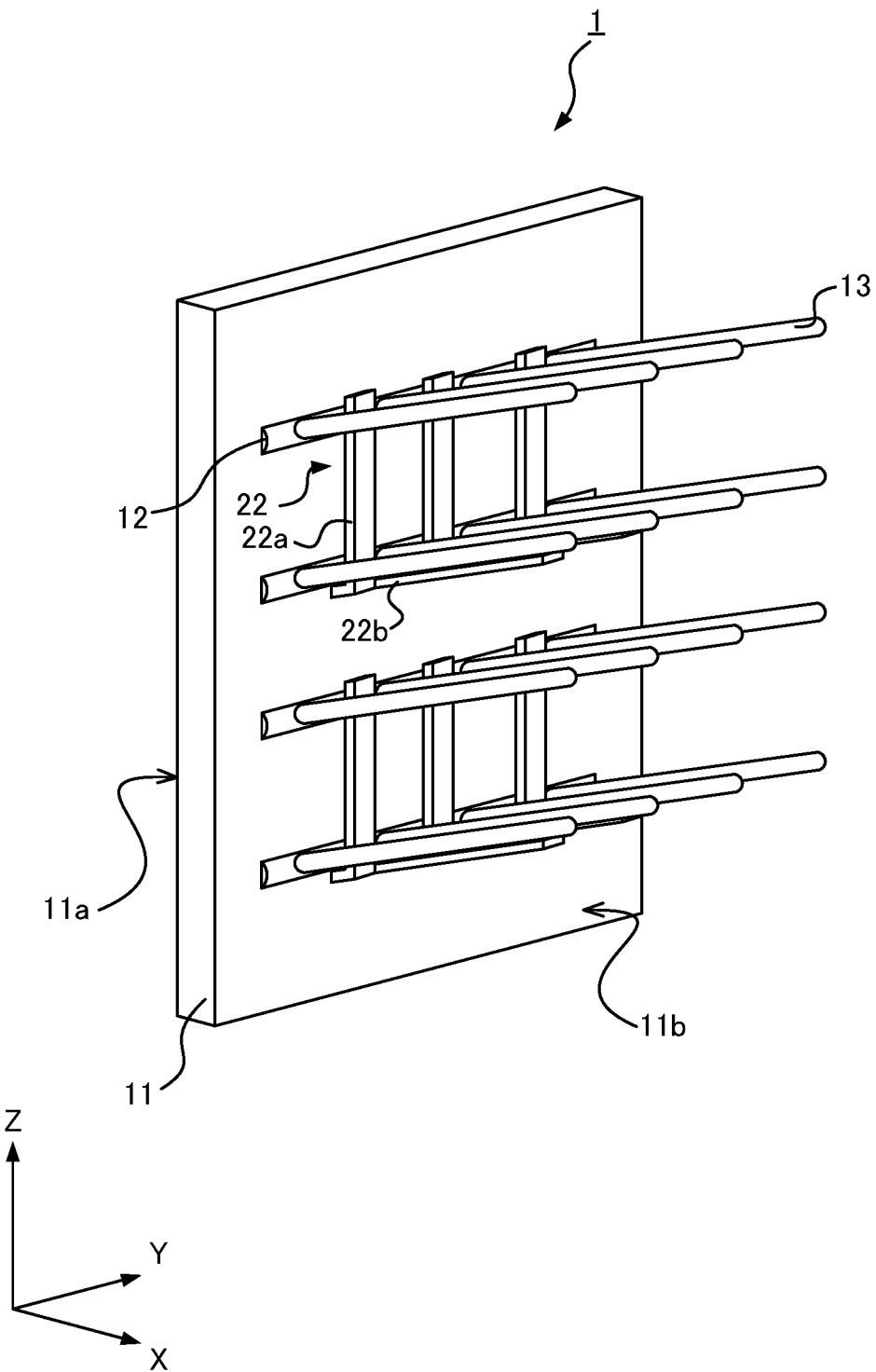
FIG. 13 is a perspective view of a cooling device according to a modified embodiment.

As another example, FIG. 13 illustrates second heat pipes 22 each of which includes a segment extending along parts of the outer peripheries of the primary pipe portions 12a in the XZ plane and another segment extending along the secondary pipe portion 12b. The second heat pipe 22 includes a bent segment 22a that extends along parts of the outer peripheries of the primary pipe portions 12a in the XZ plane like the second heat pipe 17, and a linear segment 22b that extends from the second main surface 11b of the heat-receiving block 11 along the secondary pipe portion 12b.

The flow path 18 may have any shape provided that the flow path 18 allows the second refrigerant 16 enclosed therein to circulate. For example, the flow path 18 may have a ring shape.

Figure 14:
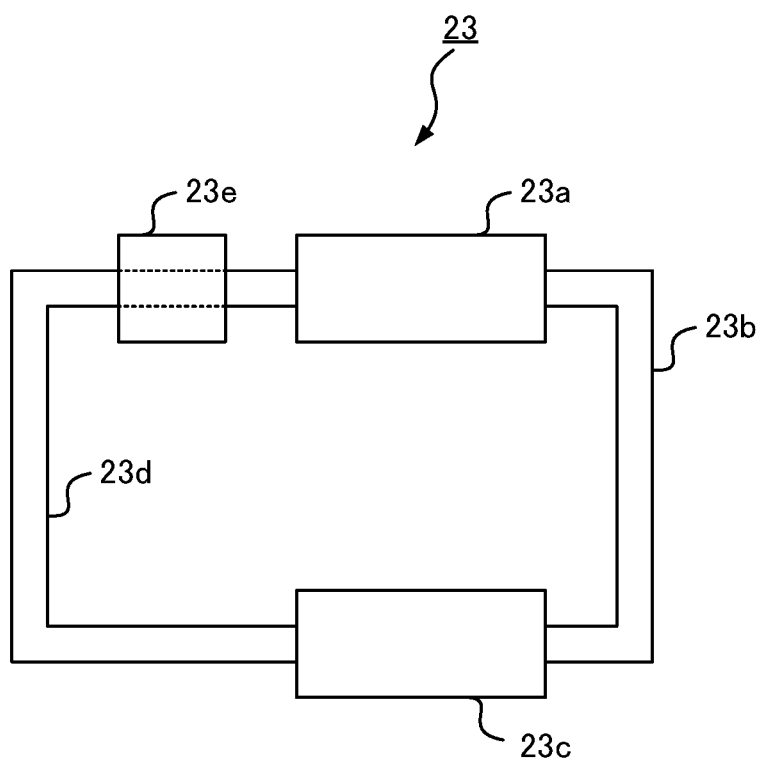
FIG. 14 is a schematic diagram of a loop heat pipe according to another embodiment.

The second heat pipe 13, 17, 20, or 21 does not necessarily be a self-excited heat pipe and may also be a loop heat pipe 23 illustrated in FIG. 14. The loop heat pipe 23 includes an evaporator 23a to transfer the heat generated at the heat emitters 31 to the second refrigerant 16 and thereby evaporate the second refrigerant 16, a vapor pipe 23b through which the evaporated second refrigerant 16 flows, a condenser 23c to discharge the heat transferred from the second refrigerant 16 and thereby condense the second refrigerant 16 into liquid, a liquid pipe 23d through which the second refrigerant 16 in the liquid state flows, and a reservoir 23e to retain a part of the second refrigerant 16 flowing through the liquid pipe 23d and thereby adjust the amount of the second refrigerant 16 flowing from the liquid pipe 23d into the evaporator 23a. In this case, the evaporator 23a is fixed at the heat-receiving block 11.

Alternatively, the loop heat pipe 23 may be formed inside a plate member, like the second heat pipes 17, 20, and 21. In this case, the plate member including the internal loop heat pipe 23 is fixed at the heat-receiving block 11 such that the evaporator 23a is located adjacent to the heat-receiving block 11.

The heat emitters 31 fixed at the heat-receiving block 11 may be switching elements including wide bandgap semiconductors. The wide bandgap semiconductor contains, for example, a silicon carbide, gallium nitride martial, or diamond. The switching element including a wide bandgap semiconductor has a reduced size in comparison to a switching element including silicon, and therefore generates a larger amount of heat per unit area. The heat generated in the wide bandgap semiconductors is received at the second heat pipes 13, 17, 20, 21, or 22, which less readily freeze than the first heat pipes 12, so that the second heat pipes 13, 17, 20, 21, or 22 can rapidly melt the frozen first refrigerant 15.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3, 4 Cooling device
11 Heat-receiving block
11a First main surface
11b Second main surface
11c, 11d, 11e, 11f, 11g Groove
12 First heat pipe
12a Primary pipe portion
12b Secondary pipe portion
13, 17, 20, 21, 22 Second heat pipe
13a, 13b, 17a, 17b, 20a, 20b, 20c, 21a, 21b, 21c Surface
14 Fin
15 First refrigerant
16 Second refrigerant
18 Flow path
19 Plate member
22a Bent segment
22b Linear segment
23 Loop heat pipe
23a Evaporator
23b Vapor pipe
23c Condenser
23d Liquid pipe
23e Reservoir
30 Power conversion apparatus
31 Heat emitter
32 Housing
32a Closed compartment
32b Open compartment
33 Partition
33a Opening
34 Intake and exhaust port
L1, L2, L3, L4, L5, L6 Bending line

The invention claimed is:

1. A cooling device comprising: a heat-receiving block comprising a first main surface to which a heat emitter is fixed; a first heat pipe fixed at the heat-receiving block; a second heat pipe fixed at the heat-receiving block and located adjacent to the first heat pipe; a first refrigerant in a gas-liquid two-phase state enclosed in the first heat pipe; and a second refrigerant in a gas-liquid two-phase state enclosed in the second heat pipe, wherein a ratio of an amount of the second refrigerant in a liquid state to a volume of the second heat pipe is higher than a ratio of an amount of the first refrigerant in a liquid state to a volume of the first heat pipe, at normal temperature, and the second heat pipe defines a flow path winding between a first edge and a second edge opposite the first edge, the first edge being closer to the heat-receiving block and closer to the first heat pipe than the second edge, the flow path having an initial point and a terminal point that coincide with each other on the first edge, the flow path extending from the first edge to the second edge, turning around and extending to the first edge, turning around and extending to the second edge again, then turning around and extending to the first edge again, and at least part of the second heat pipe is located adjacent to a portion of the first heat pipe that is fixed at the heat-receiving block.

2. The cooling device according to claim 1, wherein the second heat pipe comprises a member comprising an internal flow path.

* * * * *